United States Patent [19]

Boll et al.

[11] 4,230,958
[45] Oct. 28, 1980

[54] LOSS OF CLOCK DETECTOR CIRCUIT

[75] Inventors: Harry J. Boll, Berkeley Heights; Michael K. Maul, Whitehouse Station, both of N.J.

[73] Assignee: Bell Telephone Laboratories, Incorporated, Murray Hill, N.J.

[21] Appl. No.: 932,266

[22] Filed: Aug. 9, 1978

[51] Int. Cl.³ .............................................. H03K 5/19
[52] U.S. Cl. ................................... 307/353; 328/120; 328/151
[58] Field of Search .................... 307/200 B, 230, 232, 307/353; 328/120, 150, 151

[56] References Cited

U.S. PATENT DOCUMENTS

| | | | |
|---|---|---|---|
| 3,153,762 | 10/1964 | Johnson | 328/120 X |
| 3,204,189 | 8/1965 | Trautwein | 328/120 |
| 3,458,822 | 7/1969 | Hahn, Jr. | 328/120 |
| 3,903,474 | 9/1975 | Wiley | 328/120 |
| 4,004,162 | 1/1977 | Kato et al. | 328/120 X |
| 4,004,164 | 1/1977 | Cranford, Jr. et al. | 307/362 X |
| 4,047,059 | 9/1977 | Rosenthal | 307/230 X |
| 4,048,518 | 9/1977 | Koo | 307/DIG. 4 X |
| 4,110,748 | 8/1978 | Marino | 307/353 X |
| 4,117,348 | 9/1978 | Newman | 328/120 X |
| 4,142,159 | 2/1979 | Ingram et al. | 328/120 |

OTHER PUBLICATIONS

Mellaert, "Computer Control Back-Up", *IBM Tech. Discl. Bull.*, vol. 13, No. 5, pp. 1301-1302, 10/1970.

*Primary Examiner*—Larry N. Anagnos
*Attorney, Agent, or Firm*—David I. Caplan

[57] ABSTRACT

This invention involves a detector circuit in MOS technology for sensing "loss of clock"; that is, whenever a clock input voltage pulse source is interrupted or stops (becomes "stuck") at any level, the output voltage of the detector circuit is at a high level, but is at a low level when the clock is working properly. Such a circuit is achieved by means of a first MOS electrical inverter ($I_1$), connected for feeding its output to an MOS electrical differentiator ($\Delta$), connector for feeding its output to a thresholding MOS amplifier (A), connected for feeding its output to a unidirectional MOS current inhibitor (D), connected for feeding its output to a second MOS electrical inverter ($I_2$), connected in parallel with a storage capacitor (C) in parallel with a leakage current source ($J_L$), whereby the output of the second inverter is a binary indication of the presence vs. absence of clock pulse input to the first inverter.

9 Claims, 2 Drawing Figures

LOSS OF CLOCK DETECTOR CIRCUIT

FIELD OF THE INVENTION

This invention relates to the field of semiconductor apparatus, and more particularly to MOS integrated circuits.

BACKGROUND OF THE INVENTION

In the art of MOS (metal-oxide-semiconductor) integrated circuits, many types of such circuits require an input clock signal, that is, a periodic sequence of electrical pulses, in order to provide a means for the proper timing of various electrical circuit functions. Among such types of MOS circuits that require such timing are the semiconductor charge coupled devices (CCD) and synchronous logic circuit devices such as the microprocessor. In many of these cases it is desirable to have a means for detecting clock interruption, that is, when the input clock stops (is "stuck"), at its high, low, or any intermediate voltage level.

SUMMARY OF THE INVENTION

A circuit for detection of loss of clock is achieved (FIG. 1) by means of a first electrical inverter ($I_1$) connected for feeding its output to an electrical differentiator ($\Delta$). This differentiator is connected for feeding its output to a thresholding amplifier (A), that is, an amplifier of input signals above a threshold. This amplifier is connected for feeding its output to a unidirectional current inhibitor (D), such as an MOS diode. The current inhibitor is connected for feeding its output to a second inverter ($I_2$). The second inverter is connected in parallel both with a charge storage capacitor (C) and with a leakage current source ($J_L$). During operation, input from the clock source to be monitored is fed to the first inverter ($I_1$), whereby the resulting binary output level of the second inverter ($I_2$) indicates the presence vs. absence of clock pulses at the input, i.e., whether or not the clock is properly furnishing periodic pulses. All these circuit elements ($I_1$, $\Delta$, A, $I_2$, C, $J_L$) can be realized in MOS technology in the form of an integrated circuit in a single semiconductor crystal body, ordinarily semiconductive silicon.

In a specific embodiment of the invention (FIG. 2), the first inverter $I_1$ is provided by a pair of MOS transistors ($T_1$ and $T_2$); the differentiator $\Delta$ is provided by a capacitor ($T_3$) feeding an MOS transistor load $T_4$, the thresholding amplifier (A) is composed of two auxiliary inverters in tandem ($T_5$, $T_6$; $T_7$, $T_8$); the diode ($D_1$) is provided by an MOS transistor ($T_9$) whose gate electrode is connected to its drain; the second inverter ($I_2$) is provided by another MOS transistor pair ($T_{14}$, $T_{15}$); the storage capacitor is provided by another MOS transistor ($T_{13}$) whose source is connected to its drain; the leakage current source $J_L$ is provided by an MOS transistor ($T_{10}$) whose gate electrode is connected to the node ($N_{12}$) in the high current path between a pair of auxiliary MOS transistors ($T_{11}$, $T_{12}$) having a relatively large transconductance ratio. One of the auxiliary transistors ($T_{11}$) has its source terminal connected to a voltage source $V_{SS}$ and its gate connected to the drain; the other of these auxiliary transistors ($T_{12}$) has its drain connected to another voltage source $V_{DD}$ and its gate connected to yet another voltage source $V_{GG}$ which keeps this transistor $T_{12}$ strongly in its "on" state. In this way, the output of the second inverter is essentially binary, indicating whether or not clock input is being properly fed to the first inverter input terminal (gate of $T_2$), that is, whether clock pulses within predetermined frequency limits are being fed as input to the detector circuit.

BRIEF DESCRIPTION OF THE DRAWINGS

This invention, together with its features, objects, and advantages can be better understood from the following detailed description when read in conjunction with the drawings in which.

DETAILED DESCRIPTION

Figure 1:
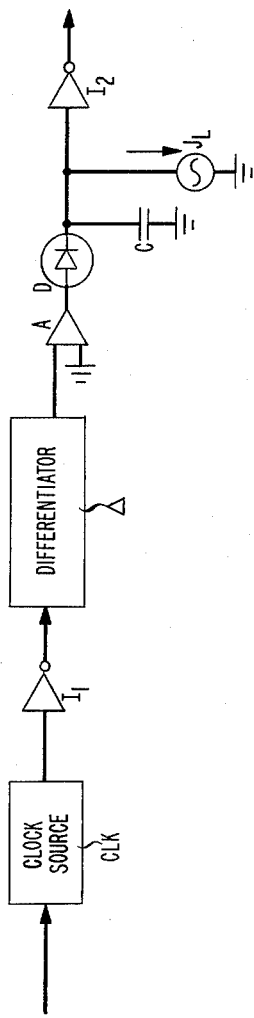
FIG. 1 is a functional block diagram of a loss-of-clock detector circuit, in accordance with the invention.

As shown in FIG. 1 a clock source to be monitored feeds a first inverter $I_1$, which feeds a differentiator $\Delta$, which feeds a thresholding amplifier A, which feeds a unidirectional current inhibitor diode D, which feeds a charge storage capacitor C in parallel both with a leakage current source $J_L$ and a second inverter $I_2$.

When the clock input source CLK is working properly by periodically delivering pulses to the first inverter, then the differentiator correspondingly periodically delivers "spikes" (almost delta functions) to the thresholding amplifier A, which charges the capacitor C positively to a maximum possible voltage $V_{DD}$ through the unidirectional diode D; thereby the output of the second inverter $I_2$ is at a relatively "low" level, the leakage current source $J_L$ being insufficient to discharge the charge storage capacitor C. On the other hand, when the clock input source is stopped (or "stuck") at any voltage level, then there is zero output of the differentiator $\Delta$, and thence the output of the amplifier A is at zero volts (or "ground"); thereby the storage capacitor C is discharged by the leakage current $J_L$ and hence the output of the second inverter goes to a relatively high voltage level, $V_{DD}$ for example. By appropriate choice of C and $J_L$, this output can be made to change within for example as little as about four periods P of the clock input as measured when working properly.

Figure 2:
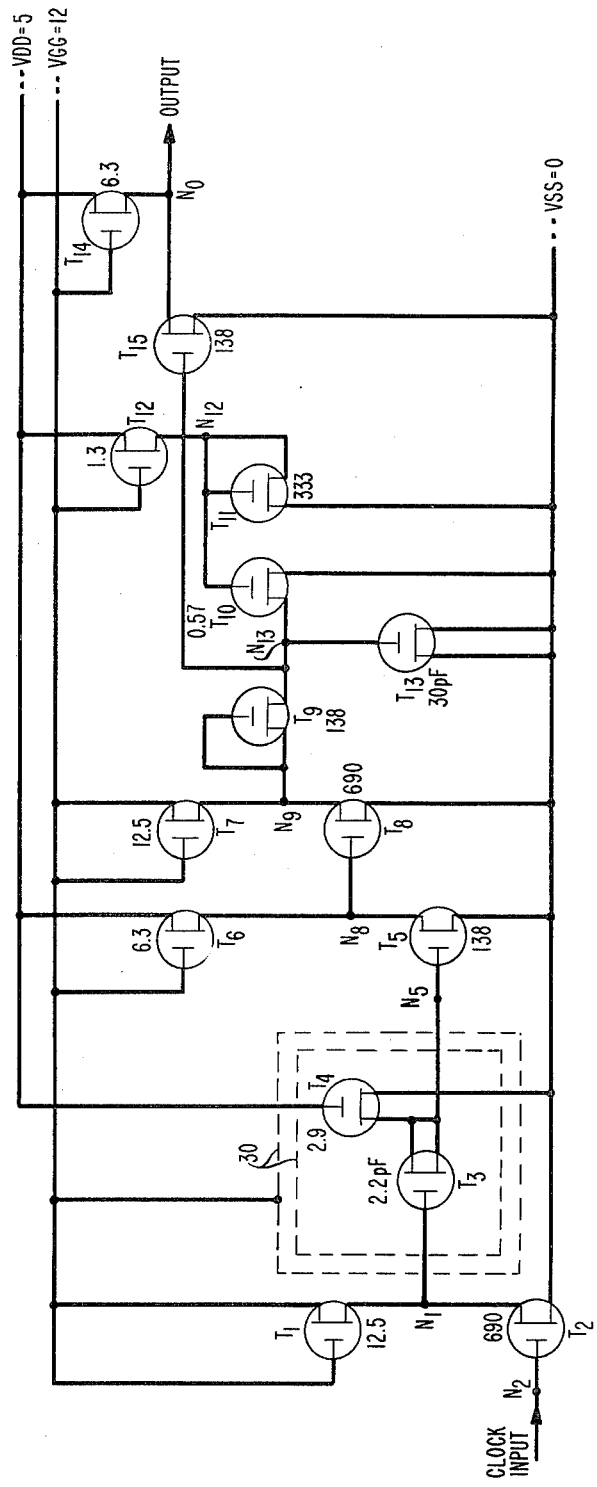
FIG. 2 is a schematic electrical circuit diagram of a loss-of-clock detector, in accordance with a specific embodiment of the invention in MOS technology.

FIG. 2 shows a schematic electrical circuit diagram of a loss-of-clock detector, in which the functional blocks of FIG. 1 are realized in MOS technology. Every transistor in FIG. 2 is an MOS transistor labeled with its transconductance $\beta$ (except for $T_3$ and $T_{13}$ whose respective capacitances rather than transconductances are given), for purposes of illustration of a specific example in N-MOS technology. The clock input is in the form of a clock pulse signal sequence of period P when operating properly, and the output of the detector circuit at node $N_0$ is then at the voltage level of essentially $V_{SS}$, but this output goes to the level of essentially $V_{DD}$ when the clock stops at any voltage level.

The parameters of the circuit shown in FIG. 2 are suitable for detection of a clock input of frequency (1/P) between about 4 kHz and 16 kHz, typically about 8 kHz.

Typical values of operating voltages are: $V_{SS}=0$; $V_{DD}=+5$ volts; and $V_{GG}=+12$ volts. It should be noted that transistors (such as $T_6$, $T_{14}$, and $T_{12}$), whose gate electrodes are connected to $V_{GG}$ and whose drains are connected to $V_{DD}$, are always strongly in their "on" states during operation; whereas transistors (such as $T_1$ and $T_7$), whose gate electrodes and drains are connected to $V_{GG}$, are characterized by a threshold voltage drop from source to drain during operation.

All transistors (including those such as $T_3$ and $T_{13}$ connected as capacitor elements) in the circuit shown in FIG. 2 are advantageously integrated in a single crystal P type silicon body, as known in N-MOS technology. Transistors $T_3$ and $T_4$ are advantageously surrounded by a guard ring (dotted line 30), of N+ type conductivity, connected to the most positive voltage supply source $V_{GG}$; this N+ guard ring is formed typically by impurity diffusion or ion-implantation at the surface of the silicon body at the same time as the source and drain diffusion or implantations of the transistors, as known in the art, in order to absorb and offer a sink for injected electrons and thereby to prevent these electrons from diffusing in the semiconductor substrate to other portions of the circuit.

The overall operation of the circuit shown in FIG. 2 is as follows:

Clock Input Working Properly: Output voltage=$V_{SS}$;
Clock Input Interrupted: Output voltage=$V_{DD}$.

This operation results as follows. In the absence of clock input, that is, when the clock suddenly stops at a fixed input voltage, say $V_2$, at input node $N_2$, the voltage at node $N_3$ asymptotically goes to a fixed value $V_3$ depending upon the fixed voltage $V_2$ at the input node $N_2$. Accordingly, the voltage at $N_5$ goes asymptotically to $V_{SS}$, thereby keeping $T_5$ in its "off" state regardless of the value of the fixed input voltage $V_2$. As a result of $T_5$ being "off", the gate of $T_8$ goes to the voltage potential of $V_{DD}$ by virtue of $T_6$ being always "on". Hence, $T_8$ is "on" and the node $N_9$ goes essentially to $V_{SS}$, the transconductance $\beta$ of $T_8$ being much greater than that of $T_7$. Thus, there is no tendency for current to flow through $T_9$, since $T_9$ conducts current only in response to positive voltages at $N_9$ which are at least a threshold above $V_{SS}$. Accordingly, the transistor $T_{15}$ turns off after $T_{10}$ discharges the capacitor $T_{13}$. At all times, $T_{10}$ remains always slightly "on" during operation since its gate is connected to the node $N_{12}$ between $T_{11}$ and $T_{12}$. As a consequence of $T_{15}$ thus being "off", the output node $N_0$ goes asymptotically to $V_{DD}$ by reason of the source-drain current path through $T_{14}$. This voltage of $V_{DD}$ at node $N_0$ represents an "alarm" indication that the clock input has been interrupted.

On the other hand, in the presence of clock input at the input node $N_2$, when this input suddenly goes negative to $V_{SS}$ at the beginning of the first half-clock period, $T_2$ turns "off", allowing the node $N_1$ to go to $V_{DD}$ and causing a positive charge Q suddenly to surge from capacitor $T_3$ to the gate of transistor $T_5$, thereby turning it "on" momentarily. This charge Q depends upon both the height of the input voltage and the series capacitance of capacitor $T_3$ and the gate-source of $T_5$. While the input remains at $V_{SS}$ for a half-clock period, the gate electrode of the transistor $T_5$ discharges charge Q through the source-drain path of transistor $T_4$, which is always "on". This discharge of charge Q advantageously occurs within a time interval less than the half-clock period (P/2) during which the clock input is at $+V_{IN}$, that is, the "on" impedance of $T_4$ is sufficiently low that the relevant RC time constant for the discharge of Q is less than this half-clock period. Thus, at the commencement (say, t=0) of this half-clock period, $T_5$ is turned "on" and remains "on" only for an initial portion of this period (until, say, t=$\Delta$t). Specifically, $T_5$ turns "off" when the discharge of Q has progressed to the point (t=$\Delta$t) where the voltage on the gate electrode of $T_5$ falls below the threshold of $T_5$. In any event, only during the time interval (0, $\Delta$t) is $T_5$ "on"; thereby the node $N_8$ quickly goes to $V_{SS}$ during this interval (0, $\Delta$t), but goes to $V_{DD}$ otherwise. Thus the combination of $T_3$ and $T_4$ serves as a voltage differentiator with output at node $N_5$.

It should be noted that although the impedance of $T_4$ in its "on" state should be sufficiently small (transconductance $\beta$ sufficiently large) that the RC time constant of $T_3$ with $T_4$ be less than a half-clock period; nevertheless, the impedance of $T_4$ in its "on" state should also be sufficiently large (transconductance $\beta$ sufficiently small) that the discharge time of node $N_5$ is longer than the rise time of the voltage transition of node $N_1$.

During the other (second) half-clock period, when the clock input voltage is $V_{DD}$, the transistor $T_5$ remains "off", since there is then no tendency for any positive charge to flow into its gate electrode (but only negative charge) injected with the substrate. Thus, during each full-clock period, only during an initial phase of duration $\Delta$t in each such period will the transistor $T_5$ be in its "on" state. Consequently, only during the initial interval (0, $\Delta$t) of each clock period will the node $N_8$ be essentially at potential $V_{SS}$, the transconductance of $T_5$ being much greater than that of $T_6$; otherwise this node $N_8$ will be at a potential equal to $V_{DD}$ (during the rest of each clock period after the initial phase $\Delta$t). As a consequence, only during each such time interval $\Delta$t will the transistor $T_8$ be "off", and hence only during each such interval ($\Delta$t) will the node $N_9$ be essentially at potential $V_{GG}$ (and at $V_{SS}$ otherwise), the transconductance of $T_8$ being much greater than that of $T_7$. Thereby, only during each such time interval $\Delta$t will current flow through the source-drain path of $T_7$ (to node $N_9$) and through $T_9$ (connected as a unidirectional current inhibiting diode) to the node $N_{13}$. This current flow brings the node $N_{13}$ to the potential $V_{GG}$ less the thresholds of $T_7$ plus $T_9$. On the other hand, during each entire clock period of duration P, the transistor $T_{10}$ is always slightly "on", as a result of its gate electrode connection to the common node $N_{12}$ between $T_{11}$ and $T_{12}$. Thus, a leakage current $J_L$ flows from $N_{13}$ through $T_{10}$. This leakage current $J_L$ is constant so long as there is any positive charge (above a threshold) on the node $N_{13}$; whereas, in the absence of such charge on this node, no leakage current flows through $T_{10}$. The value of this constant leakage current $J_L$ is equal to the constant current through $T_{11}$ multiplied by $\beta_{10}/\beta_{11}$, i.e., the ratio of the transconductance of $T_{10}$ to that of $T_{11}$. Accordingly, the parameters of $T_{10}$ and $T_{11}$ are selected such that this leakage current is sufficient to discharge the node $N_{13}$ when the clock input is interrupted and hence when no current flows through $T_9$, that is, when the value of $\Delta$t goes to zero. On the other hand, this current $J_L$ should not be sufficient to discharge the node $N_{13}$ when the clock input is working properly, and hence when the node $N_{13}$ is being brought essentially to the potential $V_{DD}$ during periodic intervals of duration $\Delta$t. Thus, if and when the clock input is interrupted, the potential of the node $N_{13}$, and hence the output of the circuit shown in FIG. 2, falls essentially to $V_{SS}$ only after at least one full period of interruption, and advantageously only after many periods.

In particular, for the parameters shown in FIG. 2, a clock input at 8 kHz would have to stop for at least about 0.5 milliseconds, i.e., about four such clock periods, before the output of the circuit would go from essentially $V_{SS}$ to $V_{DD}$.

Although the invention has been described in conjunction with a specific embodiment, various modifications can be made without departing from the scope of the invention. For example, instead of N-MOS, it is obvious that P-MOS technology can be used with appropriate changes in the values of the voltage sources $V_{SS}$, $V_{DD}$, and $V_{GG}$, and with all circuit elements still integrated in a single semiconductor crystalline body. Also, it is obvious that in certain cases, where the voltage levels of the clock input source are appropriate, there is no need for the first inverter $I_1$ and the clock input can then be fed directly to the differentiator $\Delta$. In any event, instead of the inverter $I_1$, any voltage level shifting device can be used which is characterized by an output in response to the clock input which is suitable for the differentiator. Also, the second inverter $I_2$ can be replaced with any means for detecting the voltage at node $N_{13}$ which does not draw current from this node, that is, a very high impedance output detector.

We claim:

1. Semiconductor apparatus comprising:
   (a) an MOS differentiator ($\Delta$) having an input terminal;
   (b) an MOS thresholding amplifier (A) having an input terminal connected to an output terminal of the differentiator ($\Delta$);
   (c) an MOS unidirectional current inhibitor (D) having an input terminal connected to an output terminal of the amplifier (A);
   (d) an MOS storage capacitor (C) having one terminal connected to an output terminal of the inhibitor (D);
   (e) a leakage current source ($J_L$) connected to said one terminal for providing a leakage current thereto if and only if the charge on said terminal is above a threshold, said inhibitor (D) directed for delivering charge in a direction tending to charge said one terminal and said leakage current being in a direction tending to discharge said one terminal; whereby the voltage level at said one terminal is a binary indication of whether or not clock pulse voltage is being applied to the input terminal of the differentiator ($\Delta$).

2. Semiconductor apparatus which comprises:
   (a) a first MOS voltage shifting device ($I_1$) having an input terminal for the application thereto of a clock pulse voltage source;
   (b) an MOS differentiator ($\Delta$) having an input terminal connected to an output terminal of the first device ($I_1$);
   (c) an MOS thresholding amplifier (A) having an input terminal connected to an output terminal of the differentiator ($\Delta$);
   (d) an MOS unidirectional current inhibitor (D) having an input terminal connected to an output terminal of the differentiator ($\Delta$);
   (e) an MOS storage capacitor (C) having one terminal connected to an output terminal of the inhibitor (D);
   (f) a leakage current source connected to said one terminal for providing a leakage current thereto if and only if the charge on said terminal is above a threshold, said inhibitor (D) directed for delivering charge in a direction tending to charge said one terminal and said leakage current being in a direction tending to discharge said one terminal; whereby the voltage level at said one terminal is a binary indication of whether or not the clock pulse voltage source is operative.

3. Apparatus according to claim 2 which further comprises a second MOS voltage shifting device $I_2$ whose input terminal is connected to said one terminal, whereby the voltage level at an output terminal of said second device $I_2$ is a binary output indicative of interruption of said clock pulse input.

4. Apparatus according to claim 3 in which said second device is a voltage inverter.

5. Apparatus according to claim 2 in which said first device ($I_1$) is an MOS inverter.

6. Apparatus according to claim 2 in which said inhibitor (D) is an MOS field effect transistor whose gate electrode is connected to its drain.

7. Semiconductor apparatus comprising:
   (a) a first MS transistor ($T_1$) whose source is connected to a first node $N_1$;
   (b) a second MOS transistor ($T_2$), characterized by a high transconductance at least ten times that of the first transistor ($T_1$), the drain of $T_2$ being connected to said first node ($N_1$), and the gate electrode of $T_2$ being connected to an input node ($N_2$);
   (c) a third MOS transistor ($T_3$) whose source is connected to its drain and whose gate electrode is connected to the first node ($N_1$);
   (d) a fourth MOS transistor ($T_4$), characterized in its "on" state by a fourth impedance, whose drain is connected to the drain of the third transistor ($T_3$);
   (e) a fifth MOS transistor ($T_5$) whose gate electrode is connected to the drain of the fourth transistor ($T_4$);
   (f) a sixth MOS transistor ($T_6$) whose source is connected to the drain of the fifth transistor ($T_5$), the transconductance of $T_5$ being at least ten times that of $T_6$;
   (g) a seventh MOS transistor ($T_7$) whose source is connected to the drain of an eighth MOS transistor ($T_8$), the gate electrode of said eighth transistor being connected to the drain of the fifth transistor ($T_5$), the transconductance of $T_8$ being at least ten times that of $T_7$;
   (h) a ninth MOS transistor ($T_9$) whose gate electrode is connected to its drain and to the drain of the eighth transistor ($T_8$);
   (i) a tenth MOS transistor ($T_{10}$) whose drain is connected to the source of the ninth transistor ($T_9$) and whose gate electrode is connected to the drain of an eleventh MOS transistor ($T_{11}$) and to the source of a twelfth MOS transistor ($T_{12}$), the transconductance of $T_{11}$ being at least ten times that of $T_{12}$;
   (j) a thirteenth MOS transistor ($T_{13}$) whose source is connected to its drain and whose gate electrode is connected to the drain of the tenth transistor ($T_{10}$).

8. Apparatus according to claim 7 which further includes means for producing an output voltage level corresponding to the voltage level on the gate electrode of $T_{13}$.

9. Apparatus according to claim 8 in which said means comprises fourteenth and fifteenth MOS transistors ($T_{14}$ and $T_{15}$) the ratio of whose transconductance is less than 1/10, the source of the fourteenth transistor ($T_{14}$) being connected to the drain of the fifteenth transistor ($T_{15}$), the gate electrode of the fifteenth transistor ($T_{15}$) being connected to the gate electrode of the thirteenth transistor ($T_{13}$), and the drain of the fifteenth transistor ($T_{15}$) being connected to an output node ($N_0$), whereby in response to a clock pulse source applied to the gate electrode of the second transistor ($T_2$), the voltage level at the drain of the fifteenth transistor ($T_{15}$) is a binary indication of whether or not the clock pulse source is or is not interrupted.

* * * * *